US012696618B2

(12) United States Patent
Bai et al.

(10) Patent No.: US 12,696,618 B2
(45) Date of Patent: Jul. 28, 2026

(54) ARRAY SUBSTRATE AND DISPLAY DEVICE

(71) Applicant: BOE TECHNOLOGY GROUP CO., LTD., Beijing (CN)

(72) Inventors: Shanshan Bai, Beijing (CN); Kuo Shen, Beijing (CN); Lujiang Huangfu, Beijing (CN); Hongli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 461 days.

(21) Appl. No.: 17/790,979

(22) PCT Filed: Mar. 16, 2022

(86) PCT No.: PCT/CN2022/081196
§ 371 (c)(1),
(2) Date: Jul. 6, 2022

(87) PCT Pub. No.: WO2022/194204
PCT Pub. Date: Sep. 22, 2022

(65) Prior Publication Data
US 2024/0179991 A1 May 30, 2024

(30) Foreign Application Priority Data

Mar. 16, 2021 (WO) ................ PCT/CN2021/081026

(51) Int. Cl.
*H10K 59/35* (2023.01)
*H10K 59/121* (2023.01)
(Continued)

(52) U.S. Cl.
CPC ......... *H10K 59/121* (2023.02); *H10K 59/122* (2023.02); *H10K 59/131* (2023.02);
(Continued)

(58) Field of Classification Search
CPC .... H10K 59/353; H10K 59/131; H10K 59/12; H10K 59/122; H10K 59/352;
(Continued)

(56) References Cited

U.S. PATENT DOCUMENTS 10,901,314 B2 1/2021 Ji
2011/0260952 A1* 10/2011 Hwang ............. G02F 1/134336
345/55
(Continued)

FOREIGN PATENT DOCUMENTS

CN 104269411 A 1/2015
CN 105552102 A 5/2016
(Continued)

OTHER PUBLICATIONS

Extended European search report issued by the European Patent Office in European Application No. 22770557.1; Mailing Date: Sep. 27, 2023.
(Continued)

*Primary Examiner* — Matthew C Landau
*Assistant Examiner* — David W Ward
(74) *Attorney, Agent, or Firm* — Dilworth & Barrese, LLP.; Michael J. Musella, Esq.

(57) ABSTRACT

An array substrate and a display device are provided. The array substrate includes a plurality of sub-pixel groups, each sub-pixel group includes two first color sub-pixels, one second color sub-pixel and one third color sub-pixel; in each sub-pixel group, a first connection line between centers of the two first color sub-pixels intersects with a second connection line between a center of the second color sub-pixel and a center of the third color sub-pixel, and a length of an orthographic projection of a third connection line, between a center of one of the first color sub-pixels and the center of the second color sub-pixel, on the second connec-
(Continued)

tion line is different from a length of an orthographic projection of a fourth connection line, between the center of the one of the first color sub-pixels and the center of the third color sub-pixel, on the second connection line.

19 Claims, 7 Drawing Sheets

(51) Int. Cl.
  *H10K 59/122*          (2023.01)
  *H10K 59/131*          (2023.01)
(52) U.S. Cl.
  CPC ......... *H10K 59/352* (2023.02); *H10K 59/353* (2023.02); *H10K 59/351* (2023.02)
(58) Field of Classification Search
  CPC ........ H10K 59/351–353; H10K 59/121; G02F 1/134309; G02F 2201/52
  See application file for complete search history.

(56)                References Cited

U.S. PATENT DOCUMENTS

| | | | |
|---|---|---|---|
| 2016/0078807 A1 | 3/2016 | Sun et al. | |
| 2016/0254476 A1 | 9/2016 | Park | |
| 2016/0357076 A1 | 12/2016 | Huangfu et al. | |
| 2018/0088260 A1* | 3/2018 | Jin | G02F 1/1362 |
| 2018/0308907 A1* | 10/2018 | Jin | H10K 59/352 |
| 2018/0315801 A1* | 11/2018 | Matsueda | H10K 59/1315 |
| 2019/0011830 A1* | 1/2019 | Ji | H10K 59/121 |
| 2019/0140030 A1 | 5/2019 | Huangfu et al. | |
| 2019/0252469 A1 | 8/2019 | Xiao et al. | |
| 2020/0013833 A1* | 1/2020 | Wang | H10K 59/351 |
| 2020/0043990 A1* | 2/2020 | Huangfu | H10K 59/131 |
| 2020/0066809 A1* | 2/2020 | Liu | H10K 59/121 |
| 2020/0127060 A1 | 4/2020 | Li et al. | |
| 2020/0212125 A1 | 7/2020 | Liu et al. | |
| 2020/0312941 A1 | 10/2020 | Na et al. | |
| 2020/0357862 A1* | 11/2020 | Wang | C23C 14/24 |
| 2021/0091145 A1* | 3/2021 | Huangfu | G02F 1/133514 |
| 2021/0335909 A1* | 10/2021 | Wang | H10K 59/353 |
| 2022/0208891 A1 | 6/2022 | Liu et al. | |
| 2022/0310712 A1 | 9/2022 | Zhao et al. | |
| 2023/0058293 A1 | 2/2023 | Liu et al. | |

FOREIGN PATENT DOCUMENTS

| | | |
|---|---|---|
| CN | 205355055 U | 6/2016 |
| CN | 107644888 A | 1/2018 |
| CN | 107968103 A | 4/2018 |
| CN | 207883217 U | 9/2018 |
| CN | 208077981 U | 11/2018 |
| CN | 109994503 A | 7/2019 |
| CN | 110137213 A | 8/2019 |
| CN | 110459574 A | 11/2019 |
| CN | 110599954 A | 12/2019 |
| CN | 110690266 A | 1/2020 |
| CN | 111341817 A | 6/2020 |
| CN | 111755483 A | 10/2020 |
| CN | 112038375 A | 12/2020 |
| EP | 3419054 A1 | 5/2016 |
| WO | 2018090630 A | 5/2018 |

OTHER PUBLICATIONS

Extended European search report issued by the European Patent Office in European Application No. 22770568.8; Mailing Date: Oct. 12, 2023.
U.S. Office Action in U.S. Appl. No. 17/790,955 mailed Mar. 31, 2025.
Non-Final Office Action from U.S. Appl. No. 17/790,577; Mailing Date: Mar. 6, 2026.

* cited by examiner

Display Device 500

Array Substrate 100

FIG. 12

ARRAY SUBSTRATE AND DISPLAY DEVICE

This application claims priority to PCT application PCT/CN2021/081026 filed on Mar. 16, 2021, the present disclosures of which are incorporated herein by reference in their entirety as part of the present disclosure.

TECHNICAL FIELD

Embodiments of the present disclosure relate to an array substrate and a display device.

BACKGROUND

With the continuous development of display technology, people have higher and higher requirements for the resolution of display devices. Due to the advantages of high display quality or the like, the application range of high-resolution display devices is becoming wider and wider. Generally, the resolution of the display device can be improved by reducing the size of the pixel and reducing the spacing between pixels. However, the reduction of the size of the pixel and reduction of the spacing between pixels also require higher and higher precision of the manufacturing process, which will lead to an increase in the difficulty of the manufacturing process and manufacturing cost of the display device.

In another aspect, the sub-pixel rendering (SPR) technology can make use of the difference in the resolution of different color sub-pixels by the human eye to change the conventional mode of which one pixel is simply defined by red, green and blue sub-pixels. By sharing sub-pixels of resolution-insensitive colors at certain positions among different pixels, the same pixel resolution performance can be simulated and achieved with a relatively small number of sub-pixels, thereby reducing the difficulty of the manufacturing process and the manufacturing cost.

SUMMARY

Embodiments of the present disclosure provide an array substrate and a display device. In the array substrate, the centers of the four first color sub-pixels are located on the same virtual line extending along the second direction, the two second color sub-pixels and two third color sub-pixels are located at the first side and the second side of the fourth first color sub-pixels in the first direction. Therefore, when the array substrate is used to display a vertical line extending along the second direction, the "sense of being like wave" of the vertical line seen by the human eye is weak, which can alleviate or even eliminate the graininess of the display picture, and make the line of the display picture more continuous and natural.

At least one embodiment of the present disclosure provides an array substrate, which includes: a plurality of sub-pixel repeating units, repetitively arranged along at least one of a first direction and a second direction, wherein each of the plurality of sub-pixel repeating units comprises four first color sub-pixels, two second color sub-pixels and two third color sub-pixels, the first direction intersects the second direction, in one of the plurality of sub-pixel repeating units, a shape of each of the four first color sub-pixels comprises two parallel edges that are parallel to the first direction and two parallel edges that are parallel to the second direction, centers of the four first color sub-pixels are located on a same virtual line extending along the second direction, a center of one second color sub-pixel of the two second color sub-pixels and a center of one third color sub-pixel of the two third color sub-pixels are located on a first side of the virtual line in the first direction, and a center of the other one second color sub-pixel of the two second color sub-pixels and a center of the other one third color sub-pixel of the two third color sub-pixels are located on a second side of the virtual line in the first direction.

For example, in the array substrate provided by an embodiment of the present disclosure, in one the plurality of sub-pixel repeating units, one second color sub-pixel of the two second color sub-pixels and one third color sub-pixel of the two third color sub-pixels are located on the first side of the virtual line in the first direction, the other one second color sub-pixel of the two second color sub-pixels and the other one third color sub-pixel of the two third color sub-pixels are located on the second side of the virtual line in the first direction, a shape of each of the two second color sub-pixels comprises an edge parallel to the second direction, and a shape of each of the two third color sub-pixels comprises an edge parallel to the second direction.

For example, in the array substrate provided by an embodiment of the present disclosure, in one of the plurality of sub-pixel repeating units, a shape of each of the four first color sub-pixels is rectangle.

For example, in the array substrate provided by an embodiment of the present disclosure, in one of the plurality of sub-pixel repeating units, an arrangement sequence in the second direction of the second color sub-pixel and the third color sub-pixel on the first side of the four first color sub-pixels is reversed from an arrangement sequence in the second direction of the second color sub-pixel and the third color sub-pixel on the second side of the four first color sub-pixels.

For example, in the array substrate provided by an embodiment of the present disclosure, in one of the plurality of sub-pixel repeating units, orthographic projections of the second color sub-pixel and the third color sub-pixel that are located on a same side of the four first color sub-pixels in the first direction on a reference line parallel to the first direction are overlapped with each other, a connection line between a center of the second color sub-pixel and a center of the third color sub-pixel on a same side of the four first color sub-pixels in the first direction is not parallel to the second direction.

For example, in the array substrate provided by an embodiment of the present disclosure, in one of the plurality of sub-pixel repeating units, a size in the second direction of a sub-portion away from the four first color sub-pixels of at least one of the two second color sub-pixels is smaller than a size in the second direction of a sub-portion adjacent to the four first color sub-pixels of the at least one of the two second color sub-pixels, a size in the second direction of a sub-portion away from the four first color sub-pixels of at least one of the two third color sub-pixels is smaller than a size in the second direction of a sub-portion adjacent to the four first color sub-pixels of the at least one of the two third color sub-pixels.

For example, in the array substrate provided by an embodiment of the present disclosure, a shape of the second color sub-pixel comprises an edge parallel to the first direction, an edge parallel to the second direction and an inclined edge; or, a shape of the third color sub-pixel comprises an edge parallel to the first direction, an edge parallel to the second direction and an inclined edge.

For example, in the array substrate provided by an embodiment of the present disclosure, in the plurality of sub-pixel repeating units, areas of the four first color sub-pixels are equal.

For example, in the array substrate provided by an embodiment of the present disclosure, in one of the plurality of sub-pixel repeating units, at least part of edges adjacent to the four first color sub-pixels of the second color sub-pixel and the third color sub-pixel on a same side of the four first color sub-pixels in the first direction are both parallel to the second direction, and at least part of edges away from the four first color sub-pixels of the second color sub-pixel and the third color sub-pixel on a same side of the four first color sub-pixels in the first direction are also both parallel to the second direction.

For example, in the array substrate provided by an embodiment of the present disclosure, in one of the plurality of sub-pixel repeating units, a span length in the second direction of the second color sub-pixel and the third color sub-pixel on a same side of the four first color sub-pixels in the first direction is less than or equal to a span length in the second direction of the four first color sub-pixels.

For example, in the array substrate provided by an embodiment of the present disclosure, in one of the plurality of sub-pixel repeating units, orthographic projections of light-emitting layers of at least two first color sub-pixels of the four first color sub-pixels on a base substrate are continuous.

For example, in the array substrate provided by an embodiment of the present disclosure, in one of the plurality of sub-pixel repeating units, the second color sub-pixel and the third color sub-pixel on a same side of the four first color sub-pixels in the first direction have a first parallel edge and a second parallel edge that are disposed to face and parallel to each other.

For example, in the array substrate provided by an embodiment of the present disclosure, a length of the first parallel edge and a length of the second parallel edge are equal.

For example, in the array substrate provided by an embodiment of the present disclosure, a distance between the first parallel edge and the second parallel edge is a minimum distance between the second color sub-pixel and the third color sub-pixel.

For example, in the array substrate provided by an embodiment of the present disclosure, an orthographic projection of the first parallel edge on a reference line parallel to the first direction is overlapped with an orthographic projection of the second parallel edge on the reference line parallel to the first direction.

For example, in the array substrate provided by an embodiment of the present disclosure, in one of the plurality of sub-pixel repeating units, a spacing between the two second color sub-pixels in the second direction is less than a spacing between the two third color sub-pixels in the second direction.

For example, in the array substrate provided by an embodiment of the present disclosure, in one of the plurality of sub-pixel repeating units, the four first color sub-pixels comprise two sub-pixel pairs arranged along the second direction, each of the two sub-pixel pairs comprises two first color sub-pixels, a distance between the two sub-pixel pairs is greater than a distance between the two first color sub-pixels in one of the two sub-pixel pairs.

For example, in the array substrate provided by an embodiment of the present disclosure, in one of the plurality of sub-pixel repeating units, the two first color sub-pixels in each of the two sub-pixel pairs are symmetrically disposed, and the two sub-pixel pairs are symmetrically disposed.

For example, in the array substrate provided by an embodiment of the present disclosure, in one of the plurality of sub-pixel repeating units, orthographic projections of the four first color sub-pixels on a reference line along the first direction are overlapped, and sizes of the four first color sub-pixels on a reference line in the second direction are equal.

For example, in the array substrate provided by an embodiment of the present disclosure, in one of the plurality of sub-pixel repeating units, an orthographic projection of each of the two third color sub-pixels on a reference line parallel to the second direction falls within an orthographic projection of one of the two second color sub-pixels on the reference line.

For example, in the array substrate provided by an embodiment of the present disclosure, any two adjacent first color sub-pixels of the four first color sub-pixels comprise two parallel edges that are disposed to face each other.

For example, in the array substrate provided by an embodiment of the present disclosure, the first color sub-pixel is configured to emit a light of green color, the second color sub-pixel is configured to emit a light of blue color, and the third color sub-pixel is configured to emit a light of red color.

At least one embodiment of the present disclosure further provides a display device, which includes the array substrate.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

FIG. 12 is a schematic diagram of a display device provided by an embodiment of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect.

Although, the sub-pixel rendering (SPR) technology can use a relatively small number of sub-pixels to simulate the performance of the equivalent pixel resolution, so as to reduce the difficulty of the manufacturing process and the manufacturing cost, the pixel arrangement structure using the sub-pixel rendering (SPR) technology will cause some display flaws, such as grainy display images, discontinuous lines in the display images, or the like.

Figure 1:
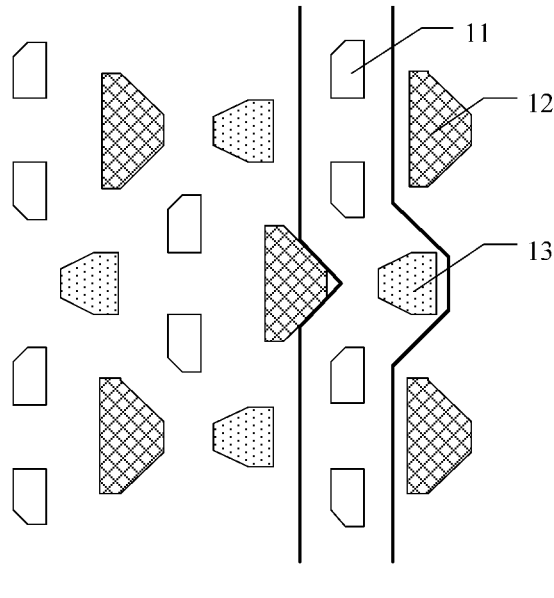
FIG. 1 is a schematic diagram of an array substrate.

FIG. 1 is a schematic diagram of an array substrate. As illustrated in FIG. 1, the array substrate 10 includes a first color sub-pixel 11, a second color sub-pixel 12, and a third color sub-pixel 13. The color of the light emitted by the first color sub-pixel 11 and the color of the light emitted by the third color sub-pixel 13 may be a color sensitive to human eyes, that is, when the human eyes perform visual synthesis, the color of the light emitted by the first color sub-pixel 11 and the color of the light emitted by the third color sub-pixel 13 have a higher proportion. As illustrated in FIG. 1, when the array substrate is used for vertical lines, because the distance between the first color sub-pixel and the third color sub-pixel is relatively far, the vertical line seen by the human eyes has a strong "sense of fluctuation," which may cause the graininess of the display image and make the lines of the display image discontinuous.

In this regard, the embodiments of the present disclosure provide an array substrate and a display device. The array substrate includes a plurality of sub-pixel groups, and each sub-pixel group includes two first color sub-pixels, one second color sub-pixel, and one third color sub-pixel; and in each of the sub-pixel groups, a first connection line between centers of the two first color sub-pixels intersects with a second connection line between a center of the second color sub-pixel and a center of the third color sub-pixel, and a length of an orthographic projection of a third connection line, between a center of one of the first color sub-pixels and the center of the second color sub-pixel, on the second connection line is different from a length of an orthographic projection of a fourth connection line, between the center of the one of the first color sub-pixels and the center of the third color sub-pixel, on the second connection line. Therefore, in the extending direction of the second connection line, the distance between the first color sub-pixel and the second color sub-pixel is different from the distance between the same first color sub-pixel and the third color sub-pixel; that is, in the extending direction of the second connection line, the distance between the first color sub-pixel and the second color sub-pixel or the third color sub-pixel may be closer. Therefore, when the array substrate is used to display the vertical line extending in the extending direction of the first connection line, and each first color sub-pixel provides a color sensitive to human eyes, the "sense of fluctuation" of the vertical line seen by the human eyes can be alleviated because the first color sub-pixel may be closer to a sub-pixel more sensitive to human eyes among the second color sub-pixel and the third color sub-pixel, so that the graininess of the display image can be alleviated or even eliminated, and the lines of the display image can be more continuous and natural.

Hereinafter, the array substrate and the display device provided by the embodiments of the present disclosure will be described with reference to the accompanying drawings.

Figure 2A:
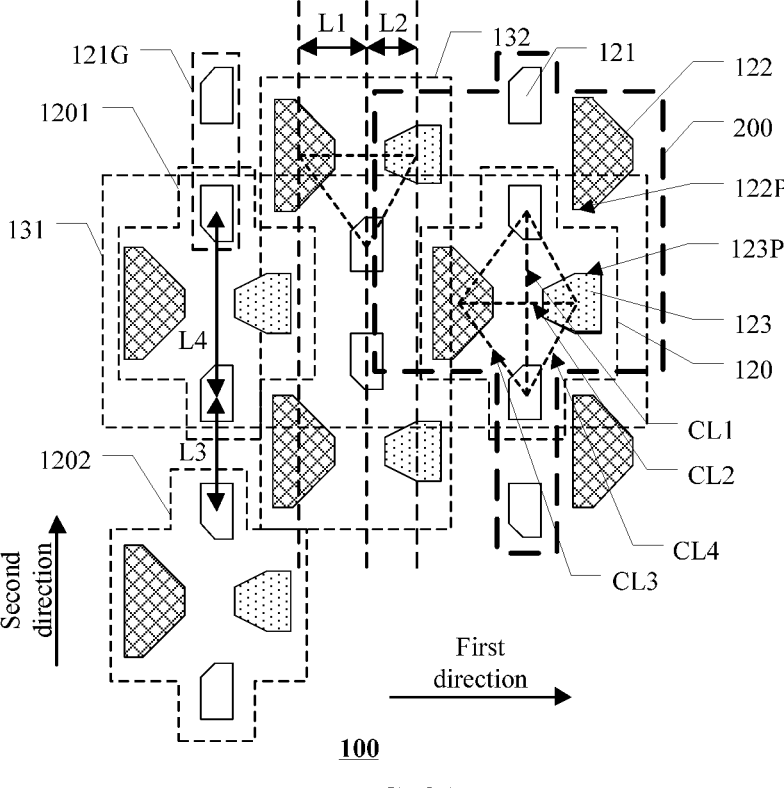
FIG. 2A is a schematic planar diagram of an array substrate provided by an embodiment of the present disclosure.
Figure 2B:
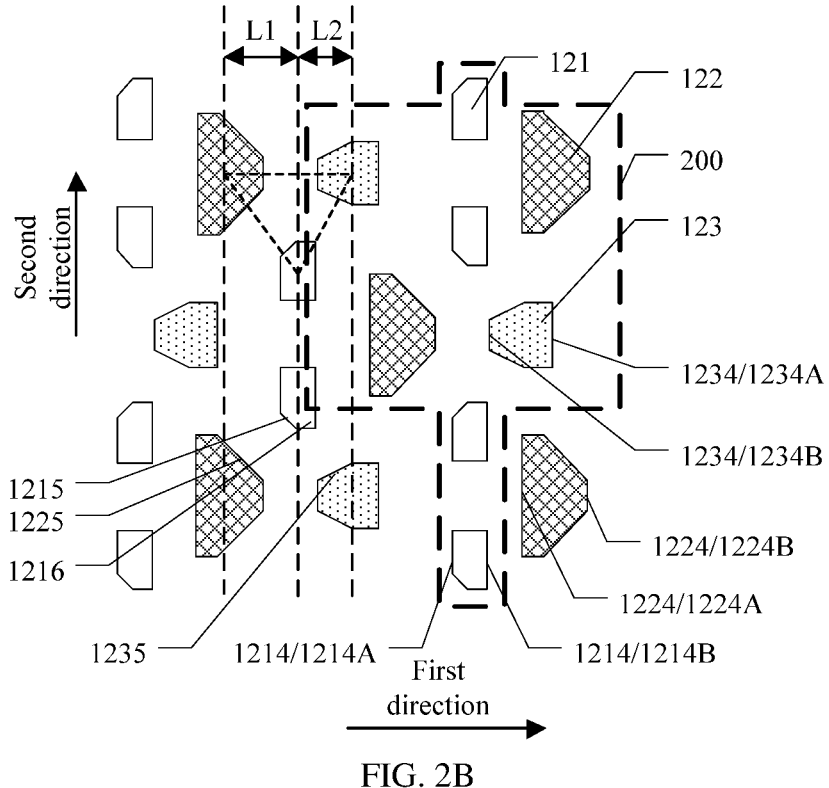
FIG. 2B is a schematic planar diagram of another array substrate provided by an embodiment of the present disclosure.

An embodiment of the present disclosure provides an array substrate. FIG. 2A is a schematic planar diagram of an array substrate provided by an embodiment of the present disclosure, and FIG. 2B is a schematic planar diagram of another array substrate provided by an embodiment of the present disclosure. As illustrated in FIG. 2A, the array substrate 100 includes a plurality of sub-pixel groups 120, and each sub-pixel group 120 includes two first color sub-pixels 121, one second color sub-pixel 122, and one third color sub-pixel 123. For example, the first color sub-pixel 121 is configured to emit light of a first color, the second color sub-pixel 122 is configured to emit light of a second color, and the third color sub-pixel 123 is configured to emit light of a third color.

For example, the first color may be green, the second color may be blue, and the third color may be red. Certainly, the embodiments of the present disclosure include but are not limited thereto.

As illustrated in FIG. 2A, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of one first color sub-pixel 121 and the center of the second color sub-pixel 122 on the second connection line CL2 is different from the length L2 of the orthographic projection of the fourth connection line CL4 between the center of the same one first color sub-pixel 121 and the center of the third color sub-pixel 123 on the second connection line CL2. It should be noted that the above-mentioned "center" refers to a luminance center or a geometric center of the effective light-emitting region of the sub-pixel.

In the array substrate provided by the embodiments of the present disclosure, as illustrated in FIG. 2B, the length L1 of the orthographic projection of the third connection line CL3 between the center of one first color sub-pixel 121 and the center of the second color sub-pixel 122 on the second connection line CL2 is greater than the length L2 of the orthographic projection of the fourth connection line CL4 between the center of the same one first color sub-pixel 121 and the center of the third color sub-pixel 123 on the second connection line CL2. That is, in the extending direction of the second connection line CL2, the distance between the first color sub-pixel 121 and the second color sub-pixel 122 is greater than the distance between the first color sub-pixel 121 and the third color sub-pixel 123; and in the extending direction of the second connection line CL2, the distance between the first color sub-pixel 121 and the third color sub-pixel 123 is closer. Therefore, when the array substrate is used to display the vertical lines extending in the extending direction of the first connection line CL1, and both of the first color sub-pixel 121 and the third color sub-pixel 123 provide sensitive colors for human eyes, because the distance between the first color sub-pixel 121 and the third color sub-pixel 123 is closer, the "sense of fluctuation" of the vertical lines seen by human eyes can be alleviated, so that the graininess of the display image can be alleviated or even eliminated, and the lines of the display image can be more continuous and natural.

In the array substrate provided by the embodiments of the present disclosure, as illustrated in FIG. 2B, the two first color sub-pixels 121 in one sub-pixel group 120 may share the second color sub-pixel 122 and the third color sub-pixel 123, thereby forming two pixel points, so that a relatively small number of sub-pixels can be used to achieve higher pixel resolution.

In some examples, the length of the orthographic projection of the third connection line between the center of one first color sub-pixel and the center of the second color sub-pixel on the second connection line is greater than the length of the orthographic projection of the fourth connection line between the center of the same one first color sub-pixel and the center of the third color sub-pixel on the second connection line, and the light-emitting efficiency of the second color sub-pixel is lower than the light-emitting efficiency of the third color sub-pixel. In the field of organic light-emitting display, the light-emitting efficiency of the light-emitting element that emits blue light is generally lower than the light-emitting efficiency of the light-emitting element that emits red light, and human eyes are more sensitive to red light than to blue light. For example, the light-emitting efficiency of the first color sub-pixel may be greater than the light-emitting efficiency of the third color sub-pixel.

In some examples, the light-emitting area of a single second color sub-pixel is larger than the light-emitting area of a single third color sub-pixel. Due to factors such as the service life and light-emitting efficiency, the light-emitting area of the sub-pixel emitting blue light is generally larger than the light-emitting area of the sub-pixel emitting red light.

In some examples, the light-emitting area of a single third color sub-pixel may be larger than the light-emitting area of a single first color sub-pixel.

In some examples, the luminous intensity per unit area of the second color sub-pixel is less than the luminous intensity per unit area of the third color sub-pixel, and the luminous intensity per unit area of the third color sub-pixel is less than the luminous intensity per unit area of the first color sub-pixel.

In some examples, the wavelength of the light emitted by the second color sub-pixel is smaller than the wavelength of the light emitted by the third color sub-pixel. In addition, the wavelength of the light emitted by the first color sub-pixel is between the wavelength of the light emitted by the second color sub-pixel and the wavelength of the light emitted by the third color sub-pixel.

In some examples, a ratio of the length L1 of the orthographic projection of the third connection line CL3 between the center of the first color sub-pixel 121 and the center of the second color sub-pixel 122 on the second connection line CL2 to the length L2 of the orthographic projection of the fourth connection line CL4 between the center of the first color sub-pixel 121 and the center of the third color sub-pixel 123 on the second connection line CL2 may range from 1 to 3. For example, as illustrated in FIG. 2B, a ratio of the length L1 of the orthographic projection of the third connection line CL3 between the center of the first color sub-pixel 121 and the center of the second color sub-pixel 122 on the second connection line CL2 to the length L2 of the orthographic projection of the fourth connection line CL4 between the center of the first color sub-pixel 121 and the center of the third color sub-pixel 123 on the second connection line CL2 may range from 1 to 1.5.

In some examples, as illustrated in FIG. 2A, the second connection line CL2, the third connection line CL3, and the fourth connection line CL4 form a non-equilateral triangle.

In some examples, as illustrated in FIG. 2A, the length of the third connection line CL3 is not equal to the length of the fourth connection line CL4.

In some examples, as illustrated in FIG. 2A, the two first color sub-pixels 121 are mirror-symmetrical with respect to the second connection line CL2. Thus, the array substrate can increase the symmetry of two pixel points in the sub-pixel group.

For example, as illustrated in FIG. 2A, the second color sub-pixel 122 and the third color sub-pixel 123 are also mirror-symmetrical with respect to the second connection line CL2, that is, the second color sub-pixel 122 and the third color sub-pixel 123 are mirror-symmetrical with respect to the straight line extending along the extending direction of the second connection line CL2.

In some examples, as illustrated in FIG. 2A, a plurality of sub-pixel groups 120 are arranged along a first direction to form a plurality of sub-pixel group rows 131, and are arranged along a second direction intersecting with the first direction to form a plurality of sub-pixel group columns 132, and two adjacent sub-pixel group columns 132 are in a staggered arrangement. It should be noted that, the above-mentioned "staggered arrangement" means that two adjacent sub-pixel group columns 132 are not aligned, but are staggered by a certain distance in the second direction. For example, two adjacent sub-pixel group columns 132 may be staggered at a ½ pitch, and the above-mentioned pitch is the distance between the centers of the second color sub-pixels in the two adjacent sub-pixel groups in the second direction.

In some examples, as illustrated in FIG. 2A, in the sub-pixel group column 132, two adjacent sub-pixel groups 120 include a first sub-pixel group 1201 and a second sub-pixel group 1202. The minimum distance L3 between the center of the first color sub-pixel 121 in the first sub-pixel group 1201 and the center of the first color sub-pixel 121 in the second sub-pixel group 1202 is less than the length L4 of the first connection line CL1, and the length L4 of the first connection line CL1 is less than 90 μm, for example, less than 78 μm or less than 56 μm. because the retinal recognition limit of human eyes is 78 μm, when the length of the first connection line CL1 is less than 78 μm, that is, when the distance between the centers of the two first color sub-pixels 121 is less than 78 μm, human eyes will not easily recognize the uneven graininess caused by the difference in the spacing between the two first color sub-pixels 121, thereby being beneficial to the screen display effect.

In some examples, as illustrated in FIG. 2A, the minimum distance L4 between the center of the first color sub-pixel 121 in the first sub-pixel group 1201 and the center of the first color sub-pixel 121 in the second sub-pixel group 1202 is less than or equal to the minimum distance L5 between the centers of two adjacent first color sub-pixels 121 in the first direction. It should be noted that the above-mentioned two adjacent first color sub-pixels in the first direction may be a lower first color sub-pixel in a sub-pixel group in a sub-pixel group row and an upper first color sub-pixel in a sub-pixel group adjacent to the above-mentioned sub-pixel group in an adjacent sub-pixel group row.

In some examples, as illustrated in FIG. 2A and FIG. 2B, two adjacent first color sub-pixels in the first direction overlap with a straight line extending in the first direction. That is, a straight line extending in the first direction may simultaneously pass through two adjacent first color sub-pixels in the first direction.

In some examples, the centers of two adjacent first color sub-pixels in the first direction may be located on a straight line extending in the first direction, that is, a straight line extending in the first direction may simultaneously pass through the centers of two adjacent first color sub-pixels in the first direction. For example, as illustrated in FIG. 2A, a sum of the minimum distance L3 between the center of the first color sub-pixel 121 in the first sub-pixel group 1201 and the center of the first color sub-pixel 121 in the second sub-pixel group 1202 and the length L4 of the first connection line CL1 may be twice the pitch.

For example, the above-mentioned first direction and second direction are perpendicular to each other, and the first direction and the second direction being perpendicular to each other includes the situation that the first direction and the second direction are strictly perpendicular, and also includes the situation that the angle between the first direction and the second direction ranges from 80 degrees to 100 degrees.

For example, as illustrated in FIG. 2A, the first direction may be the extending direction of the second connection line CL2, and the second direction may be the extending direction of the first connection line CL1. Of course, the embodiments of the present disclosure include but are not limited thereto.

In some examples, as illustrated in FIG. 2A, the centers of the two first color sub-pixels 121 in the first sub-pixel group 1201 and the centers of the two first color sub-pixels 121 in the second sub-pixel group 1202 are located on the same straight line.

For example, as illustrated in FIG. 2A, the centers of all the first color sub-pixels 121 in one sub-pixel group column 132 may be located on the same straight line.

In some examples, as illustrated in FIG. 2B, the shape of the first color sub-pixel 121 is a non-centrally symmetrical polygon, the shape of the second color sub-pixel 122 is a non-centrally symmetrical polygon, and the shape of the third color sub-pixel 123 is a non-centrally symmetrical polygon. Thus, the area of the array substrate can be fully utilized, thereby increasing the aperture ratio.

For example, the number of sides of each of the above-mentioned shape of the first color sub-pixel 121, the above-mentioned shape of the second color sub-pixel 122, and the above-mentioned shape of the third color sub-pixel 123 is greater than five.

In some examples, at least one of a group consisting of the shape of the first color sub-pixel 121, the shape of the second color sub-pixel 122, and the shape of the third color sub-pixel 123 includes a pair of parallel edges, and the pair of parallel edges includes two parallel edges.

As illustrated in FIG. 2B, the shape of the first color sub-pixel 121 includes a pair of parallel edges 1214, and the pair of parallel edges 1214 includes two parallel edges 1214A and 1214B; the shape of the second color sub-pixel 122 includes a pair of parallel edges 1224, and the pair of parallel edges 1224 includes two parallel edges 1224A and 1224B; and the shape of the third color sub-pixel 123 includes a pair of parallel edges 1234, and the pair of parallel edges 1234 includes two parallel edges 1234A and 1234B.

Therefore, when a fine metal mask (FMM) is used to fabricate the above-mentioned array substrate, the extending direction of the above-mentioned parallel edges can be the stretching direction of the fine metal mask (FMM), which is beneficial to the transmission of the fine metal mask (FMM) tension, thereby improving the product yield. It should be noted that the shape of the first color sub-pixel, the shape of the second color sub-pixel, and the shape of the third color sub-pixel in the array substrate shown in FIG. 2A and FIG. 2B all include a pair of parallel edges, but the embodiments of the present disclosure include but are not limited thereto, and the shape of at least one of the first color sub-pixel, the second color sub-pixel, and the third color sub-pixel includes a pair of parallel edges, which may also be beneficial to the transmission of the fine metal mask (FMM) tension, thereby improving the product yield.

For example, as illustrated in FIG. 2A, the parallel edges included in at least one of a group consisting of the shape of the first color sub-pixel 121, the shape of the second color sub-pixel 122, and the shape of the third color sub-pixel 123 may be parallel to the second direction. In this case, the second direction may be the stretching direction of the fine metal mask (FMM).

In some examples, at least one of a group consisting of the shape of the second color sub-pixel 122 and the shape of the third color sub-pixel 123 includes a pair of parallel edges, the pair of parallel edges includes a first parallel edge and a second parallel edge, the length of the first parallel edge is greater than that of the second parallel edge, and the distance between the first parallel edge and the first connection line is greater than the distance between the second parallel edge and the first connection line.

In some examples, as illustrated in FIG. 2A, in one sub-pixel group, the length of one of the two parallel edges close to the second color sub-pixel 122 is smaller than the length of one of the two parallel edges close to the third color sub-pixel 123.

As illustrated in FIG. 2B, the shape of the second color sub-pixel 122 includes a pair of parallel edges 1224, the pair of parallel edges 1224 includes a first parallel edge 1224A and a second parallel edge 1224B, the length of the first parallel edge 1224A is greater than that of the second parallel edge 1224B, and the distance between the first parallel edge 1224A and the first connection line CL1 is greater than the distance between the second parallel edge 1224B and the first connection line CL1. The shape of the third color sub-pixel 123 includes a pair of parallel edges 1234, the pair of parallel edges 1234 includes a first parallel edge 1234A and a second parallel edge 1234B, the length of the first parallel edge 1234A is greater than that of the second parallel edge 1234B, and the distance between the first parallel edge 1234A and the first connection line CL1 is greater than the distance between the second parallel edge 1234B and the first connection line CL1. Because the space between the second color sub-pixel 122 and the third color sub-pixel 123 is provided with two first color sub-pixels 121, the above-mentioned arrangement can make full use of the space and improve the aperture ratio.

In some examples, as illustrated in FIG. 2B, at least one of the shape of the second color sub-pixel 122 and the shape of the third color sub-pixel 123 is symmetrical with respect to the second connection line CL2.

In some examples, as illustrated in FIG. 2B, the area of the second color sub-pixel 122 is larger than the area of the third color sub-pixel 123. Due to the difference in the structure design and material system of the light-emitting device, the sub-pixels (e.g., the first color sub-pixel 121, the second color sub-pixel 122, and the third color sub-pixel 123 described above) emitting different colors have difference in service life. Therefore, by setting the area of the second color sub-pixel 122 to be larger than that of the third color sub-pixel 123, the above-mentioned difference in service life can be balanced, and the overall service life of the array substrate can be improved.

In some examples, as illustrated in FIG. 2B, the shape of the first color sub-pixel 121 includes a first bevel edge 1215 and a first right angle 1216, the shape of the second color sub-pixel 122 includes a second bevel edge 1225, the first bevel edge 1215 is parallel to the second bevel edge 1225, the shape of the third color sub-pixel 123 includes a third bevel edge 1235, and the third bevel edge 1235 is opposite to the first right angle 1216. Therefore, because the area of the second color sub-pixel 122 is larger than that of the third color sub-pixel 123, the first bevel edge 1215 of the first color sub-pixel 121 can be opposite to the second bevel edge 1225 of the second color sub-pixel 122, so as to increase the area of the first color sub-pixel and the second color sub-pixel as much as possible under the limitation of process accuracy, and the first right angle 1216 of the first color sub-pixel 121 is opposite to the third bevel edge 1235 of the third color sub-pixel 123, so as to make full use of the interval between the first color sub-pixel 121 and the third color sub-pixel 123, thereby making full use of the area of the array substrate and improving the aperture ratio.

Figure 3:
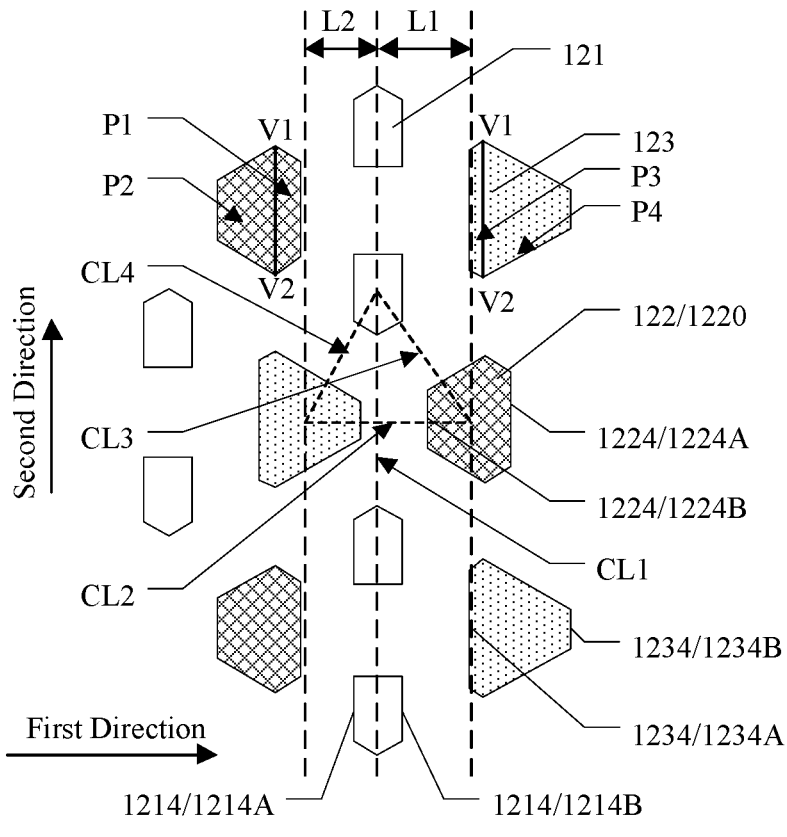
FIG. 3 is a schematic diagram of another array substrate provided by an embodiment of the present disclosure.

FIG. 3 is a schematic diagram of another array substrate provided by an embodiment of the present disclosure. As illustrated in FIG. 3, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of any first color sub-pixel 121 and the center of the second color sub-pixel 122 on the second connection line CL2 is greater than the length L2 of the orthographic projection of the fourth connection line CL4 between the center of the first color sub-pixel 121 and the center of the third color sub-pixel 123 on the second connection line CL2. Similarly, in the extending direction of the second connection line CL2, the distance between the first color sub-pixel 121 and the second color sub-pixel 122 is greater than the distance between the first color sub-pixel 121 and the third color sub-pixel 123; that is, in the extending direction of the second connection line CL2, the distance between the first color sub-pixel 121 and the third color sub-pixel 123 is closer. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "sense of fluctuation" of the vertical lines seen by human eyes can be alleviated, so that the graininess of the display image can be alleviated or even eliminated, and the lines of the display image can be more continuous and natural.

In some examples, as illustrated in FIG. 3, the shape of the second color sub-pixel 122 is a polygon 1220, the polygon 1220 includes two vertices V1 and V2, the distance between the two vertices V1 and V2 is a maximum size of the polygon 1220 in the second direction, the polygon 1220 is divided, by the connection line between the two vertices V1 and V2, into a first portion P1 and a second portion P2 which are on both sides of the connection line, and the area of the first portion P1 is not equal to the area of the second portion P2.

For example, as illustrated in FIG. 3, the polygon includes a first edge and a second edge, the first edge and the second edge are parallel to each other and parallel to the line connecting the two vertices, the length of the first edge is greater than that of the second edge, the first portion is a portion where the first edge of the polygon is located, the second portion is a portion where the second edge of the polygon is located, and a size of the first portion P1 in the first direction is smaller than a size of the second portion P2 in the first direction.

In some examples, as illustrated in FIG. 3, the shape of the third color sub-pixel 123 is a polygon 1230, the polygon 1230 includes two vertices V3 and V4, the distance between the two vertices V3 and V4 is a maximum size of the polygon 1230 in the second direction, the polygon 1230 is divided, by the connection line between the two vertices V3 and V4, into a first portion P3 and a second portion P4 which are on both sides of the connection line, and the area of the first portion P3 is not equal to the area of the second portion P4.

For example, as illustrated in FIG. 3, the size of the first portion P3 in the first direction is smaller than the size of the second portion P4 in the first direction.

In some examples, as illustrated in FIG. 3, the shape of the first color sub-pixel 121 is symmetrical with respect to the extending direction of the first connection line CL1.

For example, as illustrated in FIG. 3, the shape of the first color sub-pixel 121 includes a right-angled base symmetrical pentagon, the right-angled base symmetrical pentagon is symmetrical with respect to the first connection line CL, and the base of the right-angled base symmetrical pentagon is on a side of the vertex of the right-angled base symmetrical pentagon away from the second connection line CL2.

In some examples, as illustrated in FIG. 3, the order of the second color sub-pixel 122 and the third color sub-pixel 123 in the extending direction of the second connection line CL2 may be interchanged.

In some examples, as illustrated in FIG. 3, the shape of the first color sub-pixel 121 includes a pair of parallel edges 1214, and the pair of parallel edges 1214 includes two parallel edges 1214A and 1214B; the shape of the second color sub-pixel 122 includes a pair of parallel edges 1224, and the pair of parallel edges 1224 includes two parallel edges 1224A and 1224B; and the shape of the third color sub-pixel 123 includes a pair of parallel edges 1234, and the pair of parallel edges 1234 includes two parallel edges 1234A and 1234B. Thus, when a fine metal mask (FMM) is used to fabricate the above-mentioned array substrate, the extending direction of the above-mentioned parallel edges can be the stretching direction of the fine metal mask (FMM), which is beneficial to the transmission of the fine metal mask (FMM) tension, thereby improving the product yield.

In some examples, as illustrated in FIG. 3, the shape of the second color sub-pixel 122 includes a hexagon, the hexagon includes a parallel edge group and two opposite side groups, the parallel edge group includes two parallel edges which are parallel to each other, and each opposite side group includes two opposite sides which are disposed opposite to each other. Similarly, the shape of the third color sub-pixel 123 also includes a hexagon, the hexagon includes a parallel edge group and two opposite side groups, the parallel edge group includes two parallel edges which are parallel to each other, and each opposite side group includes two opposite sides which are disposed opposite to each other.

For example, as illustrated in FIG. 3, the first color sub-pixel 121 is configured to emit green light, the second color sub-pixel 122 is configured to emit blue light, and the third color sub-pixel 123 is configured to emit red light.

Figures 4A, 4B:
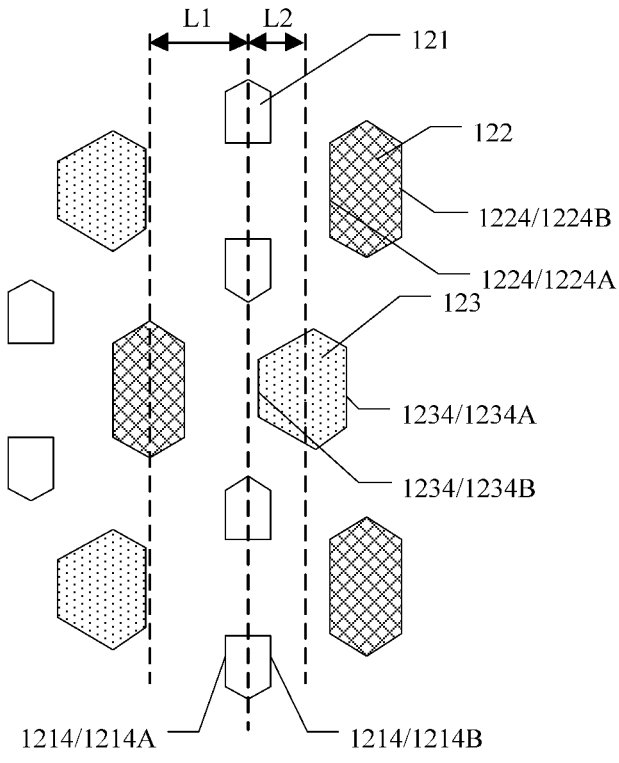
FIG. 4A is a schematic diagram of another array substrate provided by an embodiment of the present disclosure.
FIG. 4B is a schematic diagram of another array substrate provided by an embodiment of the present disclosure.

FIG. 4A is a schematic diagram of another array substrate provided by an embodiment of the present disclosure. As illustrated in FIG. 4A, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of any first color sub-pixel 121 and the center of the second color sub-pixel 122 on the second connection line CL2 is greater than the length L2 of the orthographic projection of the fourth connection line CL4 between the center of the first color sub-pixel 121 and the center of the third color sub-pixel 123 on the second connection line CL2. Similarly, in the extending direction of the second connection line CL2, the distance between the first color sub-pixel 121 and the second color sub-pixel 122 is greater than the distance between the first color sub-pixel 121 and the third color sub-pixel 123; that is, in the extending direction of the second connection line CL2, the distance between the first color sub-pixel 121 and the third color sub-pixel 123 is closer. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "fluctuation" of the vertical lines seen by human eyes can be alleviated, so that the graininess of the display image can be alleviated or even eliminated, and the lines of the display image can be more continuous and natural.

As illustrated in FIG. 4A, the shape of the third color sub-pixel 123 includes a pair of parallel edges 1234, the pair of parallel edges 1234 includes a first parallel edge 1234A and a second parallel edge 1234B, the length of the first parallel edge 1234A is greater than that of the second parallel edge 1234B, and the distance between the first parallel edge 1234A and the first connection line CL1 is greater than the distance between the second parallel edge 1234B and the first connection line CL1. Because the space between the second color sub-pixel 122 and the third color sub-pixel 123 is provided with two first color sub-pixels 121, the above arrangement can make full use of the space and improve the aperture ratio.

For example, as illustrated in FIG. 4A, the shape of the third color sub-pixel 123 includes a pair of parallel edges 1234, the pair of parallel edges 1234 includes a first parallel edge 1234A and a second parallel edge 1234B, and the length of the first parallel edge 1234A is the same as the length of the second parallel edge 1234B.

FIG. 4B is a schematic diagram of another array substrate provided by an embodiment of the present disclosure. As illustrated in FIG. 4B, the shapes of the first color sub-pixel 121, the second color sub-pixel 122 and the third color sub-pixel 123 are all symmetrical shapes. Further, the shapes of the first color sub-pixel 121, the second color sub-pixel 122 and the third color sub-pixel 123 are all left-right symmetrical hexagons.

For example, as illustrated in FIG. 4B, the shape of the second color sub-pixel 122 and the third color sub-pixel 123 has a smaller ratio (aspect ratio) of the size in the second direction to the size in the first direction than that, a ratio (aspect ratio) of the size in the second direction to the size in the first direction, of the shape of the first color sub-pixel 121.

For example, the size of the shape of the second color sub-pixel 122 in the second direction is approximately the same as the size of the shape of the second color sub-pixel 122 in the first direction, and the size of the shape of the third color sub-pixel 123 in the second direction is approximately the same as the size of the shape of the third color sub-pixel 123 in the first direction; that is, the shape of the second color sub-pixel 122 and the shape of the third color sub-pixel 123 may be a regular hexagon.

Figure 5:
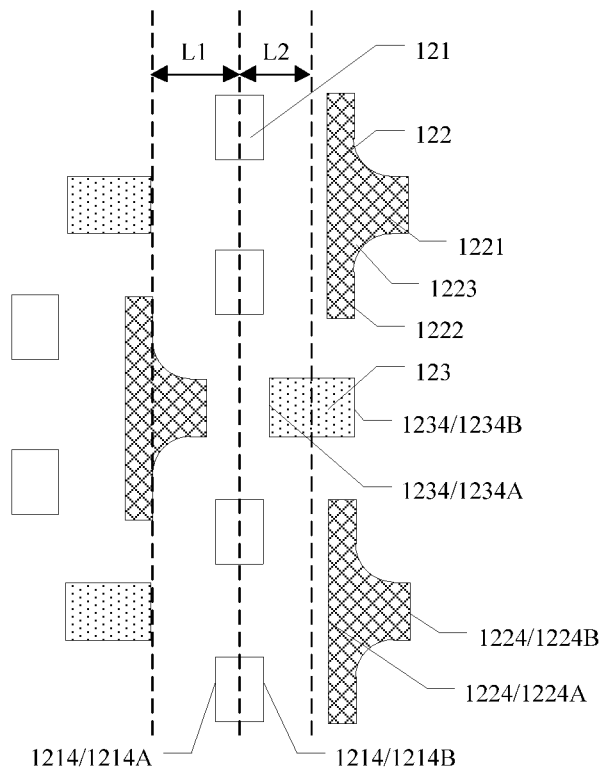
FIG. 5 is a schematic diagram of another array substrate provided by an embodiment of the present disclosure.

FIG. 5 is a schematic diagram of another array substrate provided by an embodiment of the present disclosure. As illustrated in FIG. 5, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of any first color sub-pixel 121 and the center of the second color sub-pixel 122 on the second connection line CL2 is greater than the length L2 of the orthographic projection of the fourth connection line CL4 between the center of the first color sub-pixel 121 and the center of the third color sub-pixel 123 on the second connection line CL2. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "sense of fluctuation" of the vertical lines seen by human eyes can be alleviated, so that the graininess of the display image can be alleviated or even eliminated, and the lines of the display image can be more continuous and natural.

As illustrated in FIG. 5, the shape of the first color sub-pixel 121 includes a rectangle. As illustrated in FIG. 5, the shape of the second color sub-pixel 122 includes a "T" shape, and the T shape includes a first rectangle portion 1221 extending in the first direction, a second rectangle portion 1222 extending in the second direction, and an arc portion 1223 at a connection position of the first rectangle portion 1221 and the second rectangle portion 1222. The shape of the third color sub-pixel 123 includes a rectangle. Thus, the shapes of the first color sub-pixel and the third color sub-pixel are simple and easy to manufacture, and the shape of the second color sub-pixel is beneficial to improve the space utilization of the array substrate, thereby optimizing the layout.

Similarly, as illustrated in FIG. 5, the shape of the first color sub-pixel 121 includes a pair of parallel edges 1214, the pair of parallel edges 1214 includes two parallel edges 1214A and 1214B, and the length of the parallel edge 1214A is equal to the length of the parallel edge 1214B. The shape of the second color sub-pixel 122 includes a pair of parallel edges 1224, the pair of parallel edges 1224 includes two parallel edges 1224A and 1224B, and the length of the parallel edge 1224A is greater than the length of the parallel edge 1224B. The shape of the third color sub-pixel 123 includes a pair of parallel edges 1234, and the pair of parallel edges 1234 includes two parallel edges 1234A and 1234B. Thus, when a fine metal mask (FMM) is used to fabricate the above-mentioned array substrate, the extending direction of the above-mentioned parallel edges can be the stretching direction of the fine metal mask (FMM), which is beneficial to the transmission of the fine metal mask (FMM) tension, thereby improving the product yield.

Figure 6:
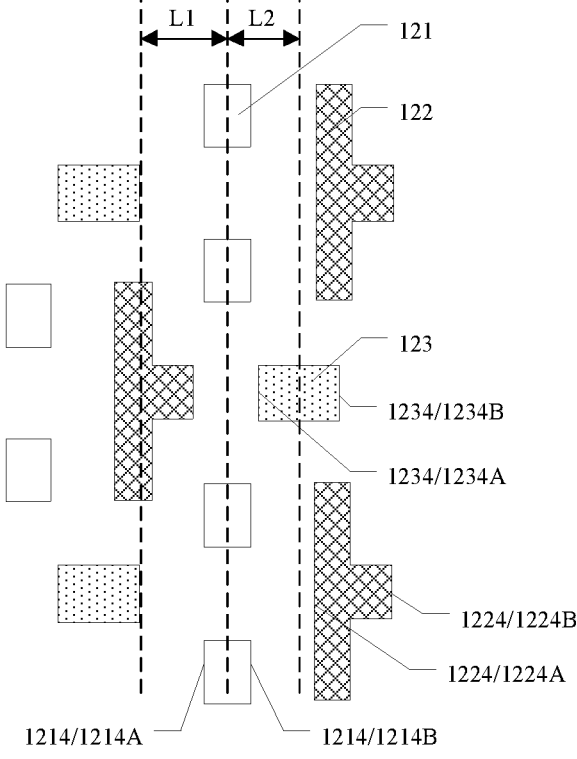
FIG. 6 is a schematic diagram of another array substrate provided by an embodiment of the present disclosure.

FIG. 6 is a schematic diagram of another array substrate provided by an embodiment of the present disclosure. As illustrated in FIG. 6, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of any first color sub-pixel 121 and the center of the second color sub-pixel 122 on the second connection line CL2 is greater than the length L2 of the orthographic projection of the fourth connection line CL4 between the center of the first color sub-pixel 121 and the center of the third color sub-pixel 123 on the second connection line CL2. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "sense of fluctuation" of the vertical lines seen by human eyes can be alleviated, so that the graininess of the display image can be alleviated or even eliminated, and the lines of the display image can be more continuous and natural.

As illustrated in FIG. 6, the shape of the first color sub-pixel 121 includes a rectangle, the shape of the second color sub-pixel 122 includes a "T" shape, and the T shape includes a first rectangle portion 1221 extending in the first direction and a second rectangle portion 1222 extending in the second direction, and the shape of the third color sub-pixel 123 includes a rectangle. Thus, the shapes of the first color sub-pixel and the third color sub-pixel are simple and easy to manufacture, and the shape of the second color sub-pixel is beneficial to improve the space utilization of the array substrate, thereby optimizing the layout.

Similarly, as illustrated in FIG. 6, the shape of the first color sub-pixel 121 includes a pair of parallel edges 1214, and the pair of parallel edges 1214 includes two parallel edges 1214A and 1214B. The shape of the second color sub-pixel 122 includes a pair of parallel edges 1224, and the pair of parallel edges 1224 includes two parallel edges 1224A and 1224B. The shape of the third color sub-pixel 123 includes a pair of parallel edges 1234, and the pair of parallel edges 1234 includes two parallel edges 1234A and 1234B. Thus, when a fine metal mask (FMM) is used to fabricate the above-mentioned array substrate, the extending direction of the above-mentioned parallel edges can be the stretching direction of the fine metal mask (FMM), which is beneficial to the transmission of the fine metal mask (FMM) tension, thereby improving the product yield.

Figures 7, 8:
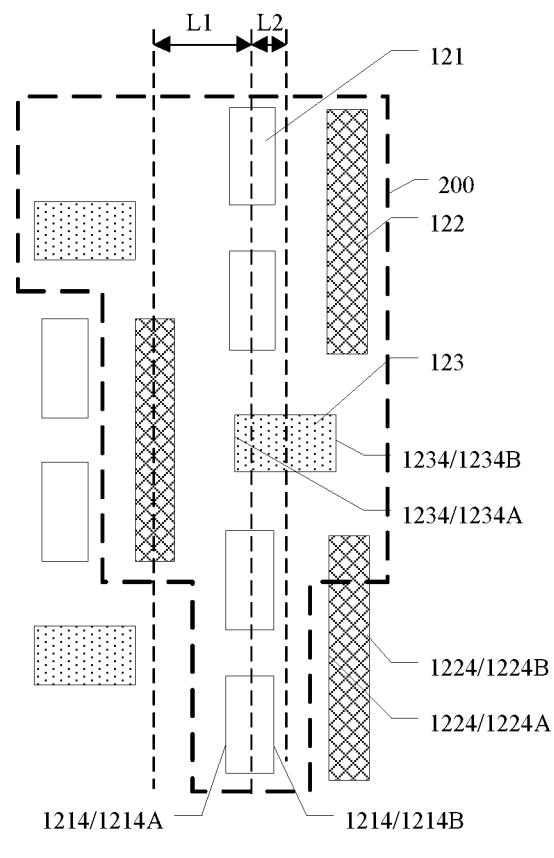
FIG. 7 is a schematic diagram of another array substrate provided by an embodiment of the present disclosure.
FIG. 8 is a schematic diagram of another array substrate provided by an embodiment of the present disclosure.

FIG. 7 is a schematic diagram of another array substrate provided by an embodiment of the present disclosure. As illustrated in FIG. 7, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of any first color sub-pixel 121 and the center of the second color sub-pixel 122 on the second connection line CL2 is greater than the length L2 of the orthographic projection of the fourth connection line CL4 between the center of the first color sub-pixel 121 and the center of the third color sub-pixel 123 on the second connection line CL2. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "sense of fluctuation" of the vertical lines seen by human eyes can be alleviated, so that the graininess of the display image can be alleviated or even eliminated, and the lines of the display image can be more continuous and natural.

As illustrated in FIG. 7, the first color sub-pixel 121, the second color sub-pixel 122, and the third color sub-pixel 123 are all rectangular in shape. Therefore, the shapes of the first color sub-pixel, the second color sub-pixel, and the third color sub-pixel are simple and easy to manufacture, and the shape of the second color sub-pixel is beneficial to improve the space utilization of the array substrate, thereby optimizing the layout.

In some examples, as illustrated in FIG. 7, the third color sub-pixel 123 extends beyond the first connection line CL1 of the two first color sub-pixels 121, so that the first color sub-pixel 121 is closer to the second color sub-pixel 123 in the direction perpendicular to the first connection line CL1. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "sense of fluctuation" of the vertical lines seen by human eyes can be alleviated, so that the graininess of the display image can be alleviated or even eliminated, and the lines of the display image can be more continuous and natural.

FIG. 8 is a schematic diagram of another array substrate provided by an embodiment of the present disclosure. As illustrated in FIG. 8, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of any first color sub-pixel 121 and the center of the second color sub-pixel 122 on the second connection line CL2 is greater than the length L2 of the orthographic projection of the fourth connection line CL4 between the center of the first color sub-pixel 121 and the center of the third color sub-pixel 123 on the second connection line CL2. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "sense of fluctuation" of the vertical lines seen by human eyes can be alleviated, so that the graininess of the display image can be alleviated or even eliminated, and the lines of the display image can be more continuous and natural.

As illustrated in FIG. 8, the shape of the first color sub-pixel 121 is a right-angled base symmetrical pentagon, the shape of the second color sub-pixel 122 is a trapezoid, the trapezoid includes a pair of parallel edges 1224, and the pair of parallel edges 1224 includes two parallel edges 1224A and 1224B. The shape of the third color sub-pixel 123 is a hexagon, the hexagon includes a pair of parallel edges 1234, and the pair of parallel edges 1234 includes two parallel edges 1234A and 1234B. Thus, when a fine metal mask (FMM) is used to fabricate the above-mentioned array substrate, the extending direction of the above-mentioned parallel edges can be the stretching direction of the fine metal mask (FMM), which is beneficial to the transmission of the fine metal mask (FMM) tension, thereby improving the product yield.

Figure 9:
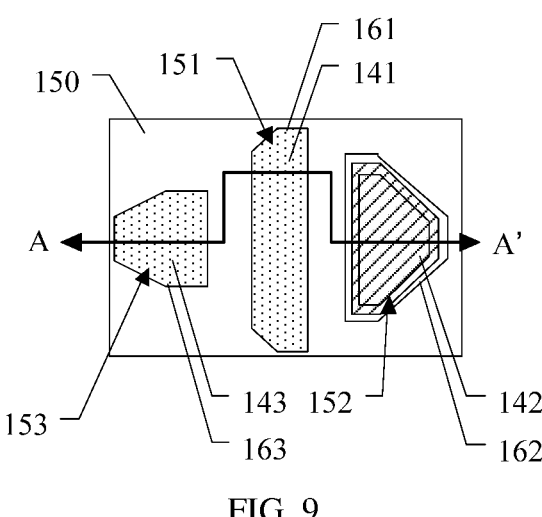
FIG. 9 is a schematic diagram of another array substrate provided by an embodiment of the present disclosure.
Figure 10:
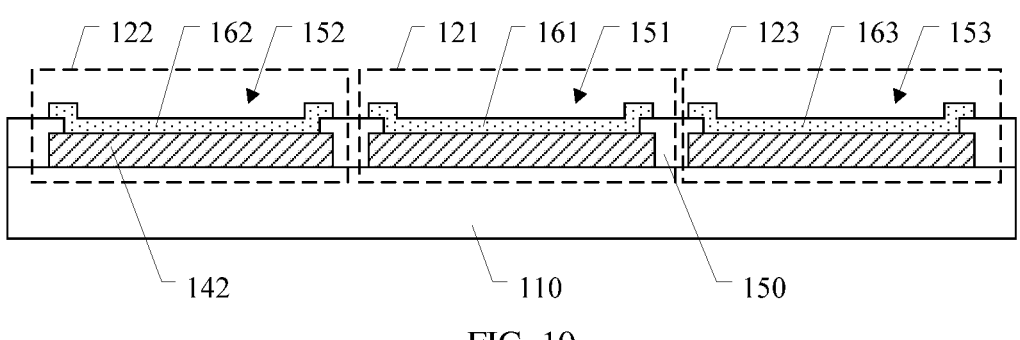
FIG. 10 is a schematic cross-sectional view of an array substrate along a direction AA' in FIG. 9 provided by an embodiment of the present disclosure.

FIG. 9 is a schematic diagram of another array substrate provided by an embodiment of the present disclosure, and FIG. 10 is a schematic cross-sectional view of an array substrate along a direction AA' in FIG. 9 provided by an embodiment of the present disclosure. As illustrated in FIG. 9 and FIG. 10, the array substrate 100 further includes a base substrate 110; a first color pixel electrode 141, a second color pixel electrode 142, and a third color pixel electrode 143, which are on the base substrate 110; a pixel defining layer 150 on a side of the first color pixel electrode 141, the second color pixel electrode 142, and the third color pixel electrode 143 away from the base substrate 110; and a first color light-emitting layer 161, a second color light-emitting layer 162, and a third color light-emitting layer 163 which are on a side of the pixel defining layer 150 away from the base substrate 110. The pixel defining layer 150 includes a first opening 151, a second opening 152, and a third opening 153, the first opening 151 exposes the first color pixel electrode 141, the second opening 152 exposes the second color pixel electrode 142, and the third opening 153 exposes the third color pixel electrode 143; the first color light-emitting layer 161 covers, through the first opening 151, a portion of the first color pixel electrode 141 exposed by the first opening 151; the second color light-emitting layer 162 covers, through the second opening 152, a portion of the second color pixel electrode 142 exposed by the second opening 152; and the third color light-emitting layer 163 covers, through the third opening 153, a portion of the third color pixel electrode 143 exposed by the third opening 153. In this case, a shape and a size of the first color sub-pixel 121 are defined by the first opening 151, a shape and a size of the second color sub-pixel 122 are defined by the second opening 152, and a shape and a size of the third color sub-pixel 123 are defined by the third opening 153. It should be noted that the above-mentioned light-emitting layer may not only include a light-emitting film layer, but may also include functional film layers such as an electron transport layer, an electron injection layer, a hole transport layer, a hole injection layer, etc.

In some examples, as illustrated in FIG. 9, two first color light-emitting layers 161 of two adjacent first color sub-pixels 121 may be integrated into one first color integrated light-emitting layer 161. That is, the two first color light-emitting layers 161 of the two first color sub-pixels 121 may be formed through the same opening of the same fine metal mask (FMM).

For example, as illustrated in FIG. 9, because the distance between the first color sub-pixel and the third color sub-pixel in the same sub-pixel group in the embodiments of the present disclosure is relatively short, first color light-emitting layers of the two first color sub-pixels in the same sub-pixel group may not be integrated together. On the contrary, in the sub-pixel column, two adjacent sub-pixel groups include a first sub-pixel group and a second sub-pixel group, and the first color sub-pixel in the first sub-pixel group close to the second sub-pixel group and the first color sub-pixel in the second sub-pixel group close to the first sub-pixel group may be integrated into one first color integrated light-emitting layer.

In some examples, as illustrated in FIG. 9, the orthographic projection of the first color integrated light-emitting layer 161 on the base substrate 110 simultaneously covers two first openings 151. In some examples, as illustrated in FIG. 9, the first color sub-pixel 121 may include the above-mentioned first color pixel electrode 141 and the first color light-emitting layer 161 disposed on the first color pixel electrode 141; the second color sub-pixel 122 includes the second color pixel electrode 142 and the second color light-emitting layer 162 disposed on the second color pixel electrode 142; and the third color sub-pixel 123 includes the third color pixel electrode 143 and the third color light-emitting layer 163 disposed on the third color pixel electrode 143.

For example, the first color pixel electrode 141 is configured to drive the first color light-emitting layer 161 to emit light of the first color, the second color pixel electrode 142 is configured to drive the second color light-emitting layer 162 to emit light of the second color, and the third color pixel electrode 143 is configured to drive the third color light-emitting layer 163 to emit light of the third color.

It should be noted that the shape and size of the above-mentioned first color sub-pixel may be the shape and size of the effective light-emitting region of the first color sub-pixel, which may be defined by the above-mentioned first via hole. Therefore, the shape of the first color pixel electrode may be different from the shape of the first color sub-pixel described above. Of course, the embodiments of the present disclosure include but are not limited thereto, and the shape of the first color pixel electrode may also be the same as the shape of the above-mentioned first color sub-pixel. Similarly, the shape and size of the above-mentioned second color sub-pixel may be the shape and size of the effective light-emitting region of the second color sub-pixel, which may be defined by the above-mentioned second via hole. Therefore, the shape of the second color pixel electrode may be the same as or different from the shape of the above-mentioned second color sub-pixel; and the shape and size of the above-mentioned third color sub-pixel may be the shape and size of the effective light-emitting region of the third color sub-pixel, which may be defined by the above-mentioned third via hole. Therefore, the shape of the third color pixel electrode may be the same as or different from the shape of the third color sub-pixel described above.

In another aspect, the specific shapes of the first color light-emitting layer, the second color light-emitting layer, and the third color light-emitting layer may be set according to the preparation process, which is not limited in the embodiments of the present disclosure. For example, the shape of the first color light-emitting layer may be determined by the shape of the opening of the mask in the manufacturing process.

In some examples, as illustrated in FIG. 9 and FIG. 10, the size of the first color pixel electrode 141 is larger than the size of the first opening 151, the size of the second color pixel electrode 142 is larger than the size of the second opening 152, and the size of the third color pixel electrode 143 is larger than the size of the third opening 153. Moreover, the distance of the first color pixel electrode 141 beyond the first opening 151, the distance of the second color pixel electrode 142 beyond the second opening 152, and the distance of the third color pixel electrode 143 beyond the third opening 153 are approximately equal. That is, the shortest distance between the edge of the first color pixel electrode 141 and the edge of the first opening 151, the shortest distance between the edge of the second color pixel electrode 142 and the edge of the second opening 152, and the shortest distance between the edge of the third color pixel electrode 143 and the edge of the third opening 153 are approximately equal.

Figure 11:
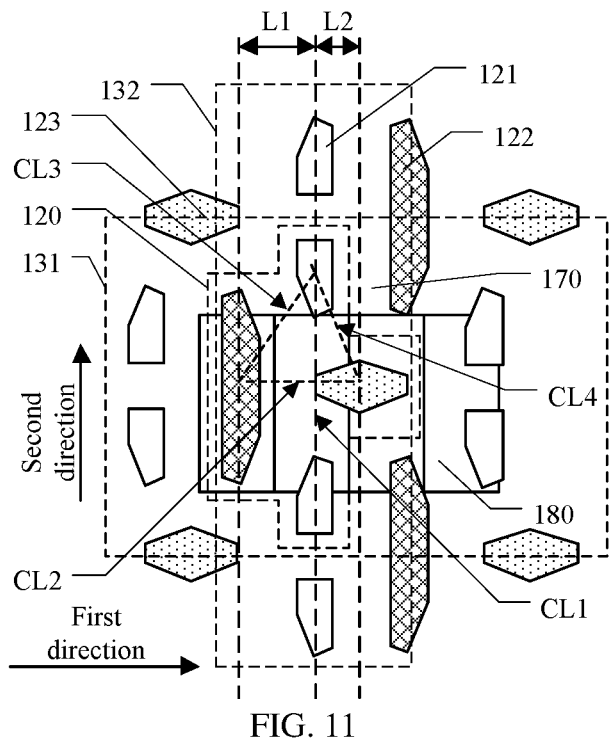
FIG. 11 is a schematic diagram of another array substrate provided by an embodiment of the present disclosure.

FIG. 11 is a schematic diagram of another array substrate provided by an embodiment of the present disclosure. As illustrated in FIG. 11, in each sub-pixel group 120, the first connection line CL1 between the centers of the two first color sub-pixels 121 intersects with the second connection line CL2 between the center of the second color sub-pixel 122 and the center of the third color sub-pixel 123, and the length L1 of the orthographic projection of the third connection line CL3 between the center of one first color sub-pixel 121 and the center of the second color sub-pixel 122 on the second connection line CL2 is different from the length L2 of the orthographic projection of the fourth connection line CL4 between the center of the same one first color sub-pixel 121 and the center of the third color sub-pixel 123 on the second connection line CL2. Therefore, when the array substrate is used to display the vertical lines extending along the extending direction of the first connection line CL1, and the first color sub-pixel 121 and the third color sub-pixel 123 both provide sensitive colors for human eyes, because the first color sub-pixel 121 is closer to the third color sub-pixel 123, the "fluctuation" of the vertical lines seen by human eyes can be alleviated, so that the graininess of the display image can be alleviated or even eliminated, and the lines of the display image can be more continuous and natural.

In some examples, as illustrated in FIG. 11, the length of the orthographic projection of the third connection line CL3 between the center of one first color sub-pixel 121 and the center of the second color sub-pixel 122 on the second connection line CL2 is greater than the length of the orthographic projection of the fourth connection line CL4 between the center of the same one first color sub-pixel 121 and the center of the third color sub-pixel 123 on the second connection line CL2.

In some examples, as illustrated in FIG. 11, in each sub-pixel group 120, in the direction of the third connection line, no other sub-pixel is provided between the first color sub-pixel 121 and the second color sub-pixel 122; and in the direction of the fourth connection line, no other sub-pixel is provided between the first color sub-pixel 121 and the third color sub-pixel 123.

In some examples, as illustrated in FIG. 11, the array substrate 100 further includes a sub-pixel interval 170 disposed between two adjacent sub-pixels, the sub-pixel is any one of a group consisting of the first color sub-pixel 121, the second color sub-pixel 122, and the third color sub-pixel 123, and each sub-pixel group 120 includes four sub-pixels separated by the sub-pixel interval 170.

In some examples, as illustrated in FIG. 11, the plurality of sub-pixel groups 120 are arranged along the first direction to form a plurality of sub-pixel group rows 131, and are arranged along the second direction intersecting with the first direction to form a plurality of sub-pixel group columns

132, and two adjacent sub-pixel group columns 132 are in a staggered arrangement. In the sub-pixel column 132, two adjacent sub-pixel groups 120 include a first sub-pixel group 1201 and a second sub-pixel group 1202, and a ratio of a distance between the vertex of the first color sub-pixel 121 away from the second sub-pixel group 1202 in the first sub-pixel group 1201 and the vertex of the first color sub-pixel 121 away from the first sub-pixel group 1201 in the second sub-pixel group 1202, to a size of the second color sub-pixel 122 in an extending direction of the first connection line ranges from 0.8 to 1.2. That is, thus, a ratio of a maximum distance of vertices of two first color sub-pixels with a minimum spacing in the first sub-pixel group and the second sub-pixel group, to a size of the second color sub-pixel in an extending direction of the first connection line ranges from 0.8 to 1.2. So that the arrangement of the pixels on the array substrate can be more uniform.

In some examples, the distance between the vertex of the first color sub-pixel 121 away from the second sub-pixel group 1202 in the first sub-pixel group 1201 and the vertex of the first color sub-pixel 121 away from the first sub-pixel group 1201 in the second sub-pixel group 1202 is approximately equal to the size of the second color sub-pixel 122 in the extending direction of the first connection line. For example, the ratio of the distance between the vertex of the first color sub-pixel 121 away from the second sub-pixel group 1202 in the first sub-pixel group 1201 and the vertex of the first color sub-pixel 121 away from the first sub-pixel group 1201 in the second sub-pixel group 1202, to the size of the second color sub-pixel 122 in the extending direction of the first connection line ranges from 0.9 to 1.1, so that the arrangement of the pixels on the array substrate can be more uniform, and the third color sub-pixel can be formed into a regular hexagon.

In some examples, the ratio of the size of the shape of the first color sub-pixel 121 in the extending direction of the first connection line CL1 to the size of the shape of the first color sub-pixel 121 in the extending direction of the second connection line CL2 ranges from 1.6 to 2.8.

For example, the ratio of the size of the shape of the first color sub-pixel 121 in the extending direction of the first connection line CL1 to the size of the shape of the first color sub-pixel 121 in the extending direction of the second connection line CL2 ranges from 1.8 to 2.6, such as 2.2.

In some examples, the ratio of the size of the shape of the second color sub-pixel 122 in the extending direction of the first connection line CL1 to the size of the shape of the second color sub-pixel 122 in the extending direction of the second connection line CL2 ranges from 4.3 to 6.7.

For example, the ratio of the size of the shape of the second color sub-pixel 122 in the extending direction of the first connection line CL1 to the size of the shape of the second color sub-pixel 122 in the extending direction of the second connection line CL2 ranges from 4.5 to 6.5, such as 5.5.

In some examples, the ratio of the size of the shape of the third color sub-pixel 123 in the extending direction of the first connection line CL1 to the size of the shape of the third color sub-pixel 123 in the extending direction of the second connection line CL2 ranges from 0.4 to 0.76.

For example, the ratio of the size of the shape of the third color sub-pixel 123 in the extending direction of the first connection line CL1 to the size of the shape of the third color sub-pixel 123 in the extending direction of the second connection line CL2 ranges from 0.5 to 0.66, such as 0.58.

In some examples, in each sub-pixel group 120, the orthographic projection of the second color sub-pixel 122 on the first connection line CL1 overlaps with the orthographic projection of the first color sub-pixel 121 on the first connection line CL1, and the orthographic projection of the third color sub-pixel 123 on the first connection line CL1 is not overlapped with the orthographic projection of the first color sub-pixel 121 on the first connection line CL1.

In some examples, in each sub-pixel group 120, the orthographic projection of the first color sub-pixel 121 on the second connection line CL2 overlaps with the ortho-graphic projection 123 of the third color sub-pixel on the second connection line CL2.

In some examples, as illustrated in FIG. 11, the array substrate 100 further includes a plurality of pixel driving circuits 180, and the plurality of pixel driving circuits 180 are provided in a one-to-one correspondence with the plu-rality of sub-pixels. As illustrated in FIG. 11, one second color sub-pixel 122, one first color sub-pixel 121, and one third color sub-pixel 123 in a sub-pixel group 120, and one first color sub-pixel 121 in an adjacent sub-pixel group 120 in the first direction may be arranged in a one-to-one correspondence with four pixel driving circuits 180 arranged in sequence in the first direction. For example, the pixel electrode in the sub-pixel may be electrically connected to the corresponding pixel driving circuit through a via hole, and the via holes corresponding to the above-mentioned four pixel driving circuits may be located approximately on the same straight line.

At least one embodiment of the present disclosure further provides an array substrate. FIG. 2A is a schematic plan view of an array substrate provided by an embodiment of the disclosure; FIG. 2B is a schematic plan view of another array substrate provided by an embodiment of the disclo-sure. As illustrated by FIG. 2A, the array substrate 100 includes a plurality of sub-pixel repeating units 200, which are repetitively arranged along at least one of a first direction and a second direction; each sub-pixel repeating unit 200 includes four first color sub-pixels 121, two second color sub-pixels 122 and two third color sub-pixels 123. The first color sub-pixels 121 are configured to emit light of a first color, the second color sub-pixels 122 are configured to emit light of a second color, and the third color sub-pixels 123 are configured to emit light of a third color.

For example, the first color may be green, the second color may be blue, and the third color may be red. Of course, the embodiments of the present disclosure include but are not limited to this.

As illustrated by FIG. 2A and FIG. 2B, in one sub-pixel repeating unit 200, the shape of each first color sub-pixel 121 includes two parallel edges parallel to the first direction and two parallel edges parallel to the second direction, the centers of four first color sub-pixels 121 are located on a same virtual line extending along the second direction; the center of one second color sub-pixel 122 of the two second color sub-pixels 122 and the center of one third color sub-pixel 123 of the two third color sub-pixels 123 are located on a first side of the virtual line in the first direction, the center of the other one second color sub-pixel 122 of the two second color sub-pixels 122 and the center of the other one third color sub-pixel 123 of the two third color sub-pixels 123 are located on a second side of the virtual line in the first direction. It should be noted that, the above-described centers may be the geometric centers of the shapes of the respective sub-pixels. Of course, the embodiments of the present disclosure include but are not limited to this, and the above-described centers may also be the brightness centers of the respective sub-pixels.

In the array substrate provided by the embodiments of the present disclosure, the centers of the four first color sub-pixels are located on the same virtual line extending along the second direction, the center of one second color sub-pixel of the two second color sub-pixels and the center of one third color sub-pixel of the two third color sub-pixels are located on the first side of the virtual line in the first direction, and the center of the other one second color sub-pixel of the two second color sub-pixels and the center of the other one third color sub-pixel of the two third color sub-pixels are located on a second side of the virtual line in the first direction, therefore, when the array substrate is used to display a vertical line extending along the second direc-tion, and when the first color sub-pixel is a color to which human eye is sensitive, the "sense of being like wave" of the vertical line seen by the human eye is weak, which can alleviate or even eliminate the graininess of the display picture, and make the line of the display picture more continuous and natural.

On other hand, the centers of the four first color sub-pixels being located on the same virtual line extending along the second direction is also advantage for color mixing, and at least two of the four first color sub-pixels can be formed using a same mask opening, such that fine sub-pixels can be realized more easily. It should be noted that, when at least two of the four first color sub-pixels can be formed using the same mask opening, at least two first color sub-pixels share one light-emitting layer (i.e., the above-described first color light-emitting layer, second color light-emitting layer and third color light-emitting layer).

In some examples, as illustrated by FIG. 2A and FIG. 2B, the array substrate 100 further includes a base substrate 110; a plurality of sub-pixel repeating units 200 are disposed on the base substrate 110.

In some examples, as illustrated by FIG. 2A and FIG. 2B, in one sub-pixel repeating unit 200, the light-emitting layers of at least two first color sub-pixels 121 of the four first color sub-pixels 121 are disposed to be continuous, that is to say, the orthographic projections of the light emitting layers of the at least two first color sub-pixels 121 on the base substrate 110 are continuous.

In some examples, as illustrated by FIG. 2A and FIG. 2B, in each sub-pixel repeating unit 200, one of the two second color sub-pixels 122 and one of the two third color sub-pixels 123 are located on the first side of the virtual line in the first direction, the other one of the two second color sub-pixels 122 and the other one of the two third color sub-pixels 123 are located on the second side of the virtual line in the first direction; the shape of each second color sub-pixel 122 includes edges parallel to the second direc-tion, and the shape of each third color sub-pixel 123 includes edges parallel to the second direction. As such, the array substrate can reduce or even eliminate the "sense of being like sawtooth" of the display picture, thereby improving the display quality.

In some examples, as illustrated by FIG. 2A and FIG. 2B, in each sub-pixel repeating unit 200, the arrangement sequence in the second direction of the second color sub-pixel 122 and the third color sub-pixel 123 on the first side of the four first color sub-pixels 121 is reversed from the arrangement sequence in the second direction of the second color sub-pixel 122 and the third color sub-pixel 123 on the second side of the four first color sub-pixels 121. In this case, one second color sub-pixel 122 and one third color sub-pixel 123 are disposed to face each other.

In some examples, as illustrated by FIG. 2A and FIG. 2B, in each sub-pixel repeating unit 200, the orthographic projections of the second color sub-pixel 122 and the third color sub-pixel 123 that are disposed on the same side of the four first color sub-pixels 121 in the first direction on a reference line parallel to the first direction are overlapped with each other, and the connection line between the centers of the second color sub-pixel 122 and the center of the third color sub-pixel 123 that are disposed on the same side of the four first color sub-pixels 121 in the first direction are not parallel to the second direction. As such, the array substrate can increase the pixel density and make full use of the space on the array substrate.

In some examples, as illustrated by FIG. 2A and FIG. 2B, in each sub-pixel repeating unit 200, the size in the second direction of a sub-portion away from the four first color sub-pixels 121 of at least one of the two second color sub-pixels 122 is less than the size in the second direction of a sub-portion adjacent to the four first color sub-pixels 121 thereof, and the size in the second direction of a sub-portion away from the four first color sub-pixels 121 of at least one of the two third color sub-pixels 123 is less than the size in the second direction of a sub-portion adjacent to the four first color sub-pixels 121 thereof. As such, the array substrate can make at least one second color sub-pixel and at least one third color sub-pixel as close as possible to the connection line of centers of the four first color sub-pixels, thereby further alleviating or even eliminating the graininess of the display picture, and making the line of the display picture more continuous and natural.

In some examples, as illustrated by FIG. 2A and FIG. 2B, the shape of the second color sub-pixel 122 includes an edge parallel to the first direction, an edge parallel to the second direction, and an inclined edge; alternatively, the shape of the third color sub-pixel 123 includes an edge parallel to the first direction, an edge parallel to the second direction, and an inclined edge. It should be noted that, the above-described inclined edge refers to an edge that is not parallel to the first direction or the second direction.

In some examples, as illustrated by FIG. 2A and FIG. 2B, in each sub-pixel repeating unit 200, the areas of the four first color sub-pixels 121 are equal. It should be noted that, the above-described areas being equal includes the case where the areas of the four first color sub-pixels are exactly equal, and also includes case where the difference between the areas of the four first color sub-pixels and the average value of the areas of the four first color sub-pixels is less than 10% of the average value, that is, also include the case where the areas of the four first color sub-pixels are approximately equal. Of course, the embodiments of the present disclosure include, but are not limited to this, and the areas of the four first color sub-pixels may also be different.

In some examples, as illustrated by FIG. 2A and FIG. 2B, in each sub-pixel repeating unit 200, the edges adjacent to the four first color sub-pixels 121 of the second color sub-pixel 122 and the third color sub-pixel 123 on the same side of the four first color sub-pixels 121 in the first direction are both parallel to the second direction, and the edges away from the four first color sub-pixels 121 of the second color sub-pixel 122 and the third color sub-pixel 123 on the same side of the four first color sub-pixels 121 in the first direction are also both parallel to the second direction. As such, the array substrate can reduce or even avoid the generation of "sense of being like sawtooth" in the second direction.

In some examples, as illustrated by FIG. 2A and FIG. 2B, in each sub-pixel repeating unit 200, the span length in the second direction of the second color sub-pixel 122 and the third color sub-pixel 122 on the same side of the four first color sub-pixels 121 in the first direction is less than or equal to the span length in the second direction of the four first color sub-pixels. It should be noted that, the above-described "span length" refers to the total length occupied by the several sub-pixels themselves and the interval therebetween.

In some examples, as illustrated by FIGS. 2A and 2B, in each sub-pixel repeating unit 200, the second color sub-pixel 122 and the third color sub-pixel 122 on the same side of the four first color sub-pixels 121 in the first direction have a first parallel edge 122$p$ and a second parallel edge 123$p$ that are disposed facing and parallel to each other. As such, the array substrate can reduce or even avoid generating the sense of being like sawtooth in the first direction.

In some examples, as illustrated by FIG. 2A and FIG. 2B, the distance between the first parallel edge 122P and the second parallel edge 123P is the minimum distance between the second color sub-pixel 122 and the third color sub-pixel 123.

In some examples, as illustrated by FIG. 2A and FIG. 2B, the length of the first parallel edge 122P and the length of the second parallel edge 123P are equal.

In some examples, as illustrated by FIG. 2A and FIG. 2B, the orthographic projection of the first parallel edge 122P on a reference line parallel to the first direction is overlapped with the orthographic projection of the second parallel edge 123P on the reference line parallel to the first direction. As such, the array substrate can improve the compactness of sub-pixels, thereby improving the pixel density.

In some examples, as illustrated by FIG. 2A and FIG. 2B, in each sub-pixel repeating unit 200, the spacing between the two second color sub-pixels 122 in the second direction is less than the spacing between the two third color sub-pixels 123 in the second direction.

In some examples, as illustrated by FIG. 2A and FIG. 2B, in each sub-pixel repeating unit 200, the four first color sub-pixels 121 include two sub-pixel pairs 121G arranged along the second direction, each sub-pixel pair 121G includes two first color sub-pixels 121, and the distance between the two sub-pixel pairs 121G is greater than the distance between the two first color sub-pixels 121 in the sub-pixel pair 121G.

In some examples, as illustrated by FIG. 2A and FIG. 2B, in each sub-pixel repeating unit 200, the two first color sub-pixels 121 in each sub-pixel pair 121G are symmetrically disposed, for example, are axisymmetric with respect to a straight line extending along the first direction; the two sub-pixel pairs 121G are symmetrically disposed, for example, are axisymmetric with respect to a straight line extending along the first direction.

In some examples, as illustrated by FIG. 2A and FIG. 2B, in each sub-pixel repeating unit 200, the orthographic projections of the four first color sub-pixels 121 on a reference line in the first direction are overlapped, and the sizes of the four first color sub-pixels 121 on a reference line in the second direction are equal.

In some examples, as illustrated by FIG. 2A and FIG. 2B, in each sub-pixel repeating unit 200, the orthographic projection of each third color sub-pixel 123 on a reference line parallel to the second direction falls within the orthographic projection of one second color sub-pixel 122 on the reference line.

In some examples, as illustrated by FIG. 2A and FIG. 2B, any two adjacent first color sub-pixels 121 of the four first color sub-pixels 121 include two parallel edges disposed facing each other. For example, as illustrated by FIG. 2A and FIG. 2B, both the parallel edges are parallel to the first direction.

FIG. 7 is a schematic view of another array substrate provided by an embodiment of the present disclosure. As illustrated by FIG. 7, in each sub-pixel repeating unit 200, the shape of each first color sub-pixel 121 is rectangle.

Figure 12:
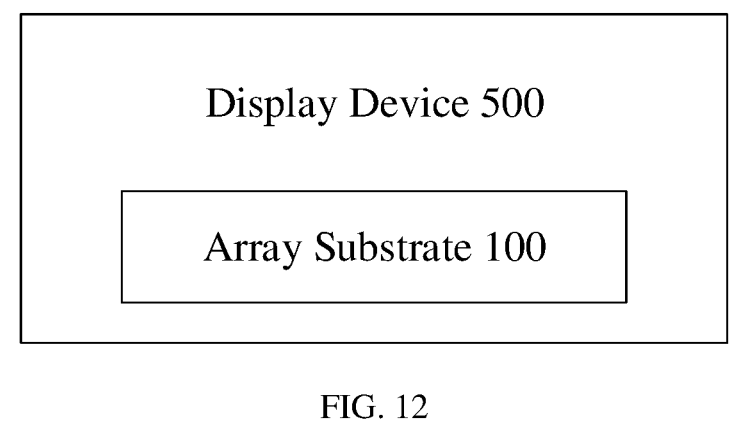

FIG. 12 is a schematic diagram of a display device provided by an embodiment of the present disclosure. As illustrated in FIG. 12, the display device 500 includes the above-mentioned array substrate 100. Because the array substrate can reduce or even eliminate the graininess of the display image and allow the lines of the display image to be more continuous and natural, the display device has higher display quality. Also, the display device can achieve a higher pixel resolution with a relatively small number of sub-pixels.

For example, in some examples, the display device may be any product or component with a display function, such as a smart phone, a tablet computer, a TV, a display, a notebook computer, a digital photo frame, a navigator, etc.

The following points required to be explained:

(1) The drawings of the embodiments of the present disclosure only relate to the structures related to the embodiments of the present disclosure, and other structures can refer to the general design.

(2) Without conflict, the embodiments of the present disclosure and the features in the embodiments may be combined with each other to obtain new embodiments.

The above are only the specific embodiments of this disclosure, but the scope of protection of this disclosure is not limited to this. Any person familiar with this technical field can easily think of changes or substitutions within the technical scope disclosed in this disclosure, which should be covered by the scope of protection of this disclosure. Therefore, the scope of protection of this disclosure should be based on the scope of protection of the claims.

What is claimed is:

1. An array substrate, comprising:

a plurality of sub-pixel repeating units, repetitively arranged along at least one of a first direction and a second direction, wherein each of the plurality of sub-pixel repeating units comprises four first color sub-pixels, two second color sub-pixels and two third color sub-pixels, the first direction intersects the second direction, wherein, in one of the plurality of sub-pixel repeating units, a shape of each of the four first color sub-pixels comprises two parallel edges that are parallel to the first direction and two parallel edges that are parallel to the second direction, centers of the four first color sub-pixels are located on a same virtual line extending along the second direction, a center of one second color sub-pixel of the two second color sub-pixels and a center of one third color sub-pixel of the two third color sub-pixels are located on a first side of the virtual line in the first direction, and a center of the other one second color sub-pixel of the two second color sub-pixels and a center of the other one third color sub-pixel of the two third color sub-pixels are located on a second side of the virtual line in the first direction, a shape of a first color sub-pixel of the four first color sub-pixels comprises a first bevel edge and a first right angle, a shape of a second color sub-pixel of the two second color sub-pixels comprises a first parallel edge parallel to the first direction, an edge parallel to the second direction and a second bevel edge, and a shape of a third color sub-pixel of the third color sub-pixels comprises a second parallel edge parallel to the first direction, an edge parallel to the second direction and a third bevel edge, in one of the plurality of sub-pixel repeating units, the first parallel edge of the second color sub-pixel and the second parallel edge of the third color sub-pixel on a same side of the four first color sub-pixels in the first direction are disposed to face each other and are parallel to each other, the first bevel edge is parallel to the second bevel edge, and the third bevel edge is opposite to the first right angle.

2. The array substrate according to claim 1, wherein, in one the plurality of sub-pixel repeating units, one second color sub-pixel of the two second color sub-pixels and one third color sub-pixel of the two third color sub-pixels are located on the first side of the virtual line in the first direction, the other one second color sub-pixel of the two second color sub-pixels and the other one third color sub-pixel of the two third color sub-pixels are located on the second side of the virtual line in the first direction, the shape of each of the two second color sub-pixels comprises an edge parallel to the second direction, and the shape of each of the two third color sub-pixels comprises an edge parallel to the second direction.

3. The array substrate according to claim 1, wherein, in one of the plurality of sub-pixel repeating units, a shape of each of the four first color sub-pixels is rectangle.

4. The array substrate according to claim 1, wherein, in one of the plurality of sub-pixel repeating units, an arrangement sequence in the second direction of the second color sub-pixel and the third color sub-pixel on the first side of the four first color sub-pixels is reversed from an arrangement sequence in the second direction of the second color sub-pixel and the third color sub-pixel on the second side of the four first color sub-pixels.

5. The array substrate according to claim 1, wherein, in one of the plurality of sub-pixel repeating units, orthographic projections of the second color sub-pixel and the third color sub-pixel that are located on a same side of the four first color sub-pixels in the first direction on a reference line parallel to the first direction are overlapped with each other, a connection line between a center of the second color sub-pixel and a center of the third color sub-pixel on a same side of the four first color sub-pixels in the first direction is not parallel to the second direction.

6. The array substrate according to claim 1, wherein, in one of the plurality of sub-pixel repeating units, a size in the second direction of a sub-portion away from the four first color sub-pixels of at least one of the two second color sub-pixels is smaller than a size in the second direction of a sub-portion adjacent to the four first color sub-pixels of the at least one of the two second color sub-pixels, a size in the second direction of a sub-portion away from the four first color sub-pixels of at least one of the two third color sub-pixels is smaller than a size in the second direction of a sub-portion adjacent to the four first color sub-pixels of the at least one of the two third color sub-pixels.

7. The array substrate according to claim 1, wherein, in one of the plurality of sub-pixel repeating units, at least part of edges adjacent to the four first color sub-pixels of the second color sub-pixel and the third color sub-pixel on a same side of the four first color sub-pixels in the first direction are both parallel to the second direction, and at least part of edges away from the four first color sub-pixels of the second color sub-pixel and the third color sub-pixel on a same side of the four first color sub-pixels in the first direction are also both parallel to the second direction.

8. The array substrate according to claim 1, wherein, in one of the plurality of sub-pixel repeating units, a span length in the second direction of the second color sub-pixel and the third color sub-pixel on a same side of the four first color sub-pixels in the first direction is less than or equal to a span length in the second direction of the four first color sub-pixels.

9. The array substrate according to claim 1, wherein, in one of the plurality of sub-pixel repeating units, ortho-graphic projections of light-emitting layers of at least two first color sub-pixels of the four first color sub-pixels on a base substrate are continuous.

10. The array substrate according to claim 1, wherein, a distance between the first parallel edge and the second parallel edge is a minimum distance between the second color sub-pixel and the third color sub-pixel.

11. The array substrate according to claim 1, wherein, an orthographic projection of the first parallel edge on a refer-ence line parallel to the first direction is overlapped with an orthographic projection of the second parallel edge on the reference line parallel to the first direction.

12. The array substrate according to claim 1, wherein, in one of the plurality of sub-pixel repeating units, a spacing between the two second color sub-pixels in the second direction is less than a spacing between the two third color sub-pixels in the second direction.

13. The array substrate according to claim 1, wherein, in one of the plurality of sub-pixel repeating units, the four first color sub-pixels comprise two sub-pixel pairs arranged along the second direction, each of the two sub-pixel pairs comprises two first color sub-pixels, a distance between the two sub-pixel pairs is greater than a distance between the two first color sub-pixels in one of the two sub-pixel pairs, in one of the plurality of sub-pixel repeating units, the two first color sub-pixels in each of the two sub-pixel pairs are symmetrically disposed, and the two sub-pixel pairs are symmetrically disposed.

14. The array substrate according to claim 1, wherein, in one of the plurality of sub-pixel repeating units, ortho-graphic projections of the four first color sub-pixels on a reference line along the first direction are overlapped, and orthographic projections of the four first color sub-pixels on a reference line in the second direction have sizes that are equal.

15. The array substrate according to claim 1, wherein, in one of the plurality of sub-pixel repeating units, an ortho-graphic projection of each of the two third color sub-pixels on a reference line parallel to the second direction falls within an orthographic projection of one of the two second color sub-pixels on the reference line.

16. The array substrate according to claim 1, wherein, any two adjacent first color sub-pixels of the four first color sub-pixels comprise two parallel edges that are disposed to face each other.

17. The array substrate according to claim 1, wherein, the first color sub-pixel is configured to emit a light of green color, the second color sub-pixel is configured to emit a light of blue color, and the third color sub-pixel is configured to emit a light of red color.

18. A display device, comprising the array substrate according to claim 1.

19. The array substrate according to claim 1, wherein length of the first parallel edge and a length of the second parallel edge are equal.

* * * * *